(12) United States Patent
Nishiguchi

(10) Patent No.: US 11,335,594 B2
(45) Date of Patent: May 17, 2022

(54) METHOD FOR MANUFACTURING SEMICONDUCTOR DEVICE AND SEMICONDUCTOR DEVICE

(71) Applicant: Mitsubishi Electric Corporation, Tokyo (JP)

(72) Inventor: Kohei Nishiguchi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 17/294,299

(22) PCT Filed: Mar. 25, 2019

(86) PCT No.: PCT/JP2019/012435
§ 371 (c)(1),
(2) Date: May 14, 2021

(87) PCT Pub. No.: WO2020/194432
PCT Pub. Date: Oct. 1, 2020

(65) Prior Publication Data
US 2022/0013408 A1    Jan. 13, 2022

(51) Int. Cl.
*H01L 21/00* (2006.01)
*H01L 21/768* (2006.01)
*H01L 23/498* (2006.01)
*H01L 21/28* (2006.01)
*H01L 23/532* (2006.01)

(52) U.S. Cl.
CPC .. *H01L 21/76859* (2013.01); *H01L 21/28044* (2013.01); *H01L 23/49838* (2013.01); *H01L 23/53242* (2013.01); *H01L 23/53257* (2013.01)

(58) Field of Classification Search
None
See application file for complete search history.

(56) References Cited

U.S. PATENT DOCUMENTS

2018/0366369 A1* 12/2018 Lin .................. H01L 21/02211

FOREIGN PATENT DOCUMENTS

| JP | H06-061225 A | 3/1994 |
| JP | H07-273107 A | 10/1995 |
| JP | H08-321613 A | 12/1996 |
| JP | 2018-056246 A | 4/2018 |

OTHER PUBLICATIONS

International Search Report; Written Opinion; and Notification of Transmittal of the International Search Report and the Written Opinion of the International Searching Authority, or the Declaration issued in PCT/JP2019/012435; dated Jun. 11, 2019.

* cited by examiner

*Primary Examiner* — Reema Patel
(74) *Attorney, Agent, or Firm* — Studebaker & Brackett PC

(57) ABSTRACT

A method for manufacturing a semiconductor device (10) includes, in the following order: forming a first insulating film (14) on a semiconductor substrate (12); forming, on the first insulating film (14), wiring in which at least the uppermost layer is made of Au (16); implanting ions, which do not impair insulating properties even when implanted into the insulating film (14), into the upper surface of the wiring (16) and a region not covered with the wiring (16) on the upper surface of the first insulating film (14); and forming a second insulating film (18) that covers the wiring (16).

12 Claims, 10 Drawing Sheets

METHOD FOR MANUFACTURING SEMICONDUCTOR DEVICE AND SEMICONDUCTOR DEVICE

FIELD

The present invention relates to a method for manufacturing a semiconductor device in which wiring made of Au is covered with an insulating film, and to a semiconductor device.

BACKGROUND

In high-frequency devices using compound semiconductors such as GaAs and GaN, Au excellent in reliability is used as a material for wiring of transistors. The wiring is covered with an insulating film (e.g., SiO and SiN) for the purpose of protecting the device. However, with Au being chemically stable, there is a problem that when the insulating film is formed on Au, the adhesion between Au and the insulating film is weak, and the insulating film on the wiring is easily peeled off.

To solve this problem, Ti is implanted on Au by an ion implantation method, which is then annealed to form an Au—Ti alloy layer on a wiring surface layer, thereby improving the adhesion of the insulating film (e.g., see PTL 1).

As another countermeasure, there is also shown a method in which Si is implanted on Au by an ion implantation method, which is then annealed to form a Si-containing region on the wiring surface, thereby enhancing the adhesion with an insulating film that also contains Si (e.g., see PTL 2).

CITATION LIST

Patent Literature

[PTL 1] JP 06-061225 A
[PTL 2] JP 07-273107 A

SUMMARY

Technical Problem

However, in a case where Ti ions or Si ions are implanted into the wiring made of Au, when the ions are implanted into the insulating film under the wiring, the insulating properties of the insulating film under the wiring are impaired. It is thus necessary to form a resist on the insulating film under the wiring so that ions are not implanted into the insulating film under the wiring at the time of ion implantation, which causes a problem that the number of manufacturing steps increases.

The present invention has been made to solve the above problem, and it is an object of the present invention to provide a method for manufacturing a semiconductor device and a semiconductor device that achieve both improvement in adhesion between wiring made of Au and an insulating film on the wiring and prevention of an increase in the number of manufacturing steps.

Solution to Problem

A method for manufacturing a semiconductor device according to the present invention includes, in the following order, a step of forming a first insulating film on a semiconductor substrate, a step of forming, on the first insulating film, wiring in which at least an uppermost layer is made of Au, a step of implanting ions, that do not impair insulating properties even when implanted into the insulating film, into an upper surface of the wiring and a region not covered with the wiring on an upper surface of the first insulating film and a step of forming a second insulating film that covers the wiring.

A semiconductor device according to the present invention includes a semiconductor substrate, a first insulating film on the semiconductor substrate, wiring in which at least an uppermost layer is made of Au on the first insulating film and the second insulating film covering the wiring, wherein an insulating non-destructive element exists in a vicinity of an upper surface of the wiring and in a vicinity of a region not covered with the wiring on an upper surface of the first insulating film at a concentration of $1\times10^{17}$ cm$^{-3}$ or more and $1\times10^{21}$ cm$^{-3}$ or less.

Advantageous Effects of Invention

According to the method for manufacturing a semiconductor device and the semiconductor device in the present invention, Since the ions which do not impair the insulation properties even when implanted into the insulating film under the wiring made of Au are implanted into the upper surface of the wiring, it is possible to achieve both improvement in adhesion between the wiring made of Au and the insulating film on the wiring and prevention of an increase in the number of manufacturing processes.

DESCRIPTION OF EMBODIMENTS

First Embodiment

Figure 1:
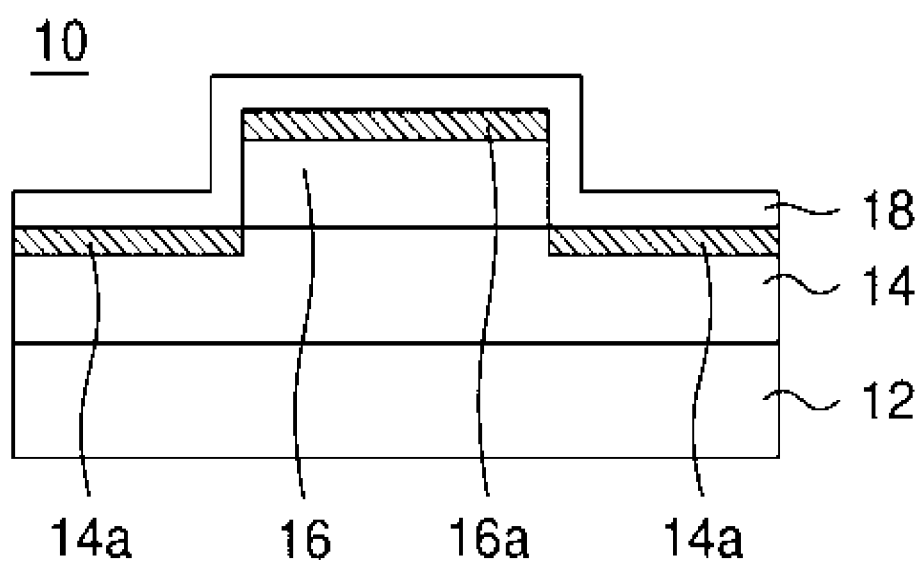
FIG. 1 is a cross-sectional view of the semiconductor device according to the first embodiment.

FIG. 1 is a diagram of a semiconductor device 10 according to a first embodiment. The semiconductor device 10 includes a semiconductor substrate 12. The semiconductor substrate 12 is made of GaAs, GaN, SiC, or Si.

On the semiconductor substrate 12, an insulating film 14 is formed. The insulating film 14 is made of polyimide, benzocyclobutene (BCB), or a chemical vapor deposition (CVD) film. Here, the CVD film is an insulating film such as SiO or SiN formed by CVD.

Wiring 16 is formed on the insulating film 14. The wiring 16 is formed of Au on a base such as Ti, Ta, Cr, Ti/Pt, or TiW. Here, Ti/Pt is a structure in which Pt is formed on Ti, and TiW is an alloy of Ti and W. Since the wiring 16 is formed of Au on the base, at least the uppermost layer of the wiring 16 is formed of Au. Further, since a portion above the base on the side surface of the wiring 16 is made of Au, at least the upper portion of the side surface of the wiring 16 is made of Au. Note that the base is omitted in the figure because being thinner than Au.

An ion implantation layer 16a into which ions have been implanted is formed on the upper surface of the wiring 16. The ion species is an element that does not impair insulation properties even when implanted into the insulating film 14, and is referred to herein as an insulating non-destructive element. Specifically, the insulating non-destructive element is Ar or N. An ion implantation layer 14a is also formed in a region not covered with the wiring 16 on the upper surface of the insulating film 14. The concentration of the insulating non-destructive element in each of the ion implantation layer 16a and the ion implantation layer 14a is $1\times10^{17}$ cm$^{-3}$ or more and $1\times10^{21}$ cm$^{-3}$ or less.

An insulating film 18 is formed so as to cover the wiring 16. The insulating film 18 is SiO, SiN, SiON, AlO, TaO, or the like.

Figure 2A:
FIGS. 2A-2D are views showing the method for manufacturing the semiconductor device according to the first embodiment.

A method for manufacturing the semiconductor device 10 according to a first embodiment will be described below. First, as shown in FIG. 2(a), the insulating film 14 is formed on the semiconductor substrate 12.

Figure 2B:
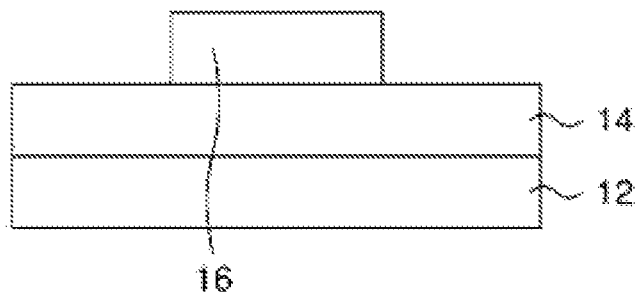

Next, a base is formed on the insulating film 14, and as illustrated in FIG. 2(b), wiring 16 made of Au is formed on the base by a method such as vapor deposition, sputtering, or plating.

Figure 2C:
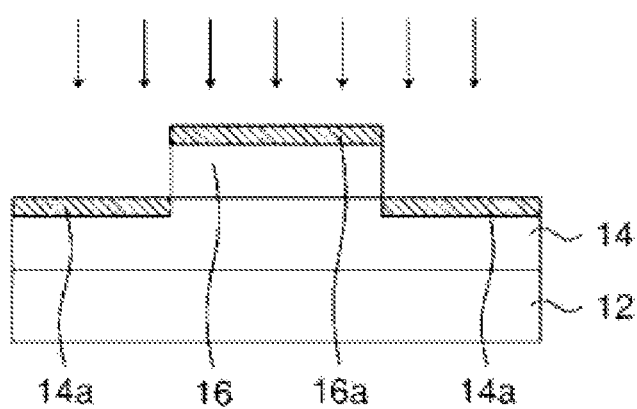

Then, as illustrated in FIG. 2(c), ions are implanted from a direction perpendicular to the semiconductor substrate 12 by an ion implantation method. Implantation conditions are, for example, an acceleration energy of 5 to 50 keV and a dose of $1\times10^{12}$ ions/cm$^2$ or more. By the ion implantation, an ion implantation layer 16a and an ion implantation layer 14a are formed on the upper surface of the wiring 16 and the upper surface of the insulating film 14, respectively. The ion implantation layer 16a formed on the upper surface of the wiring 16 comes into a chemically unstable state due to the ion being implanted.

Figure 2D:
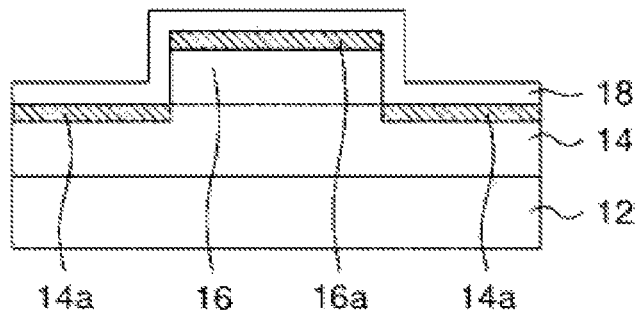

Next, as shown in FIG. 2(d), the insulating film 18 is formed by CVD or atomic layer deposition (ALD) so as to cover the wiring 16.

As described above, according to the first embodiment, since the ion implantation layer 16a on the upper surface of the wiring 16 is chemically unstable, the adhesion between the wiring 16 and the insulating film 18 is improved, and since the ion species does not impair the insulation properties even when implanted into the insulating film 14, it is not necessary to form a protective resist on the insulating film 14 before the ion implantation.

Second Embodiment

Figure 3:
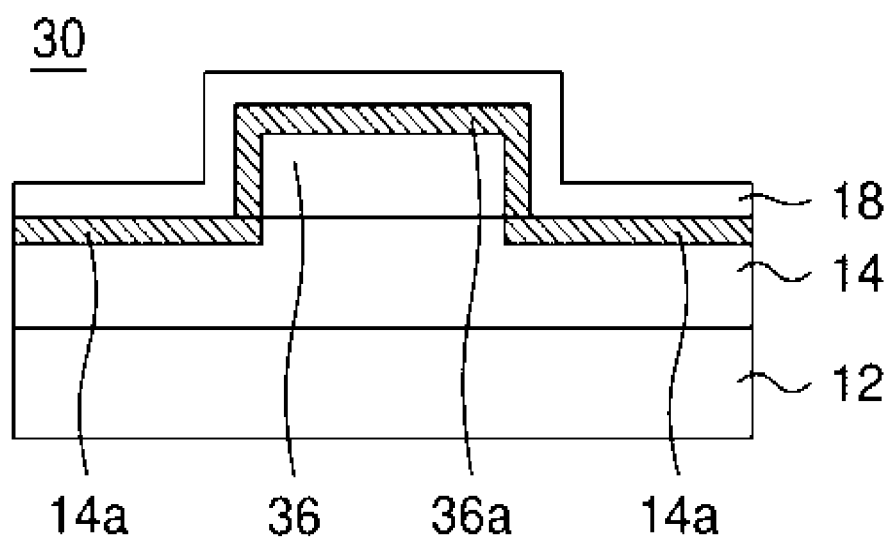
FIG. 3 is a cross-sectional view of the semiconductor device according to the second embodiment.
Figure 4A:
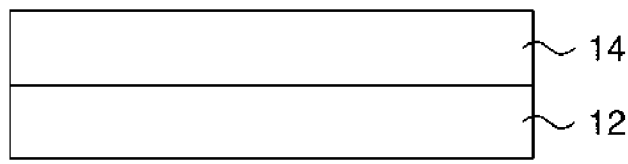
FIGS. 4A-4D are views showing the method for manufacturing the semiconductor device according to the second embodiment.
Figure 4B:
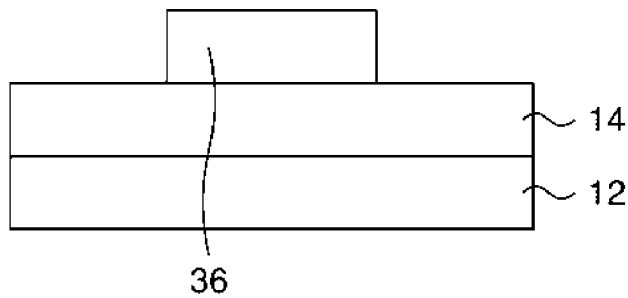
Figure 4C:
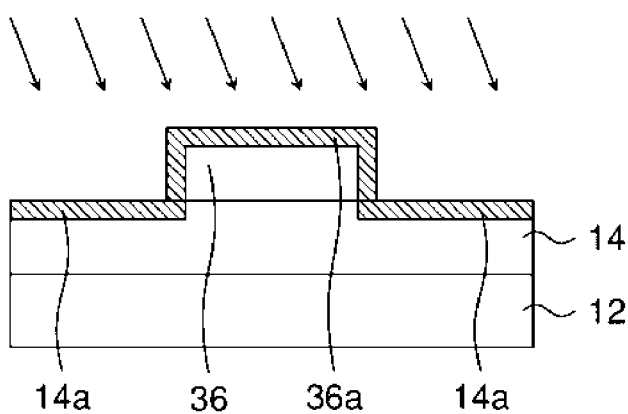
Figure 4D:
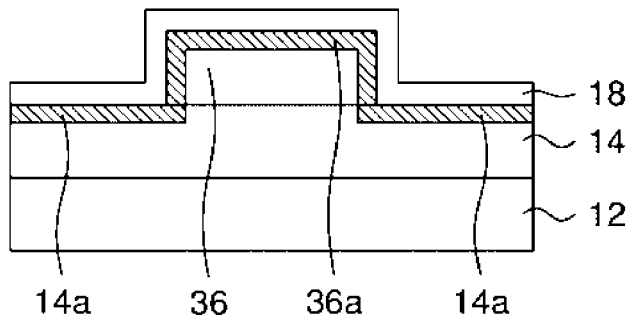

FIG. 3 is a diagram of a semiconductor device 30 according to a second embodiment. The semiconductor device 30 is the same as the semiconductor device 10 according to the first embodiment but differs in that an ion implantation layer 36a is also formed on the side surface of wiring 36.

FIG. 4 is a diagram illustrating a method for manufacturing a semiconductor device 30 according to the second embodiment. In this manufacturing method, FIGS. 4(a) to 4(d) are performed sequentially. The method for manufacturing the semiconductor device 30 according to the second embodiment is the same as that of the first embodiment but differs in that an oblique ion implantation method is used for ion implantation (FIG. 4(c)). In the oblique ion implantation, ions are implanted obliquely from a direction perpendicular to the semiconductor substrate 12. Thus, the ion implantation layer 36a is also formed on the side surface of the wiring 36. As the oblique ion implantation method, either of the following methods is used: a method in which the implantation is performed while a wafer is rotated about the vertical direction; and a method in which division implantation is performed while the rotation angle of the wafer is changed.

As described above, according to the second embodiment, since the ion implantation layer 36a is also formed on the side surface of the wiring 36, the adhesion between the wiring 36 and the insulating film 18 is further improved.

Third Embodiment

Figure 5:
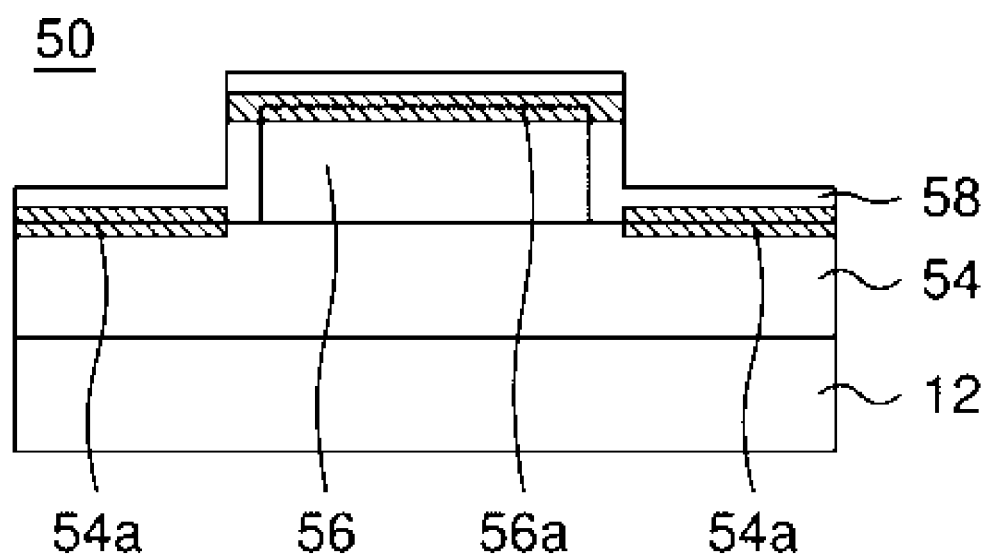
FIG. 5 is a cross-sectional view of the semiconductor device according to the third embodiment.
Figure 6A:
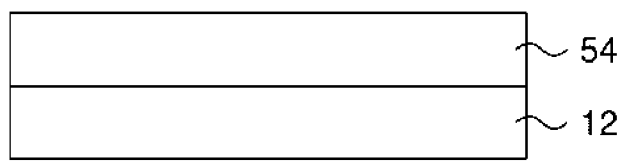
FIGS. 6A-6D are views showing the method for manufacturing the semiconductor device according to the third embodiment.
Figure 6B:
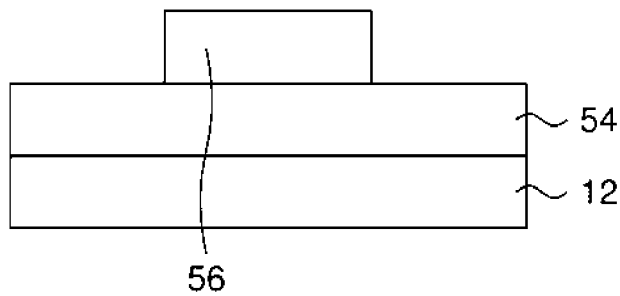
Figure 6C:
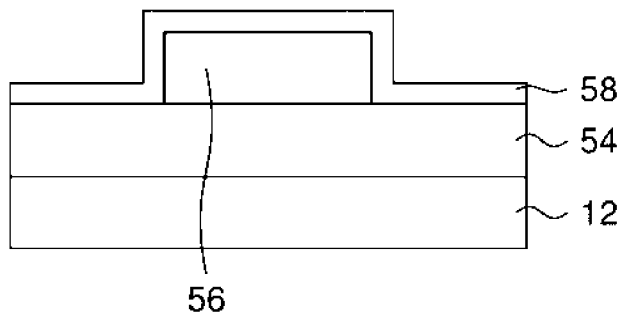
Figure 6D:
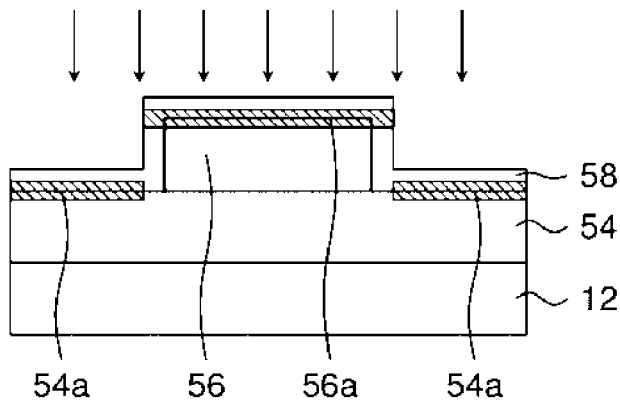

FIG. 5 is a diagram of a semiconductor device 50 according to a third embodiment. The semiconductor device 50 is the same as the semiconductor device 10 according to the first embodiment but differs in the vertical distribution of ions implanted into wiring 56 and an insulating film 54.

FIG. 6 is a diagram illustrating a method for manufacturing a semiconductor device 50 according to the third embodiment. In this manufacturing method, FIGS. 6(a) to 6(d) are performed sequentially. In the first embodiment, the ion implantation is performed before the formation of the insulating film 18, but in the third embodiment, the ion implantation is performed after the formation of the insulating film 58 (FIGS. 6(c) and 6(d)). The ion implantation is performed not only on the wiring 56 and the insulating film 54 but also on the insulating film 58.

Figure 7:
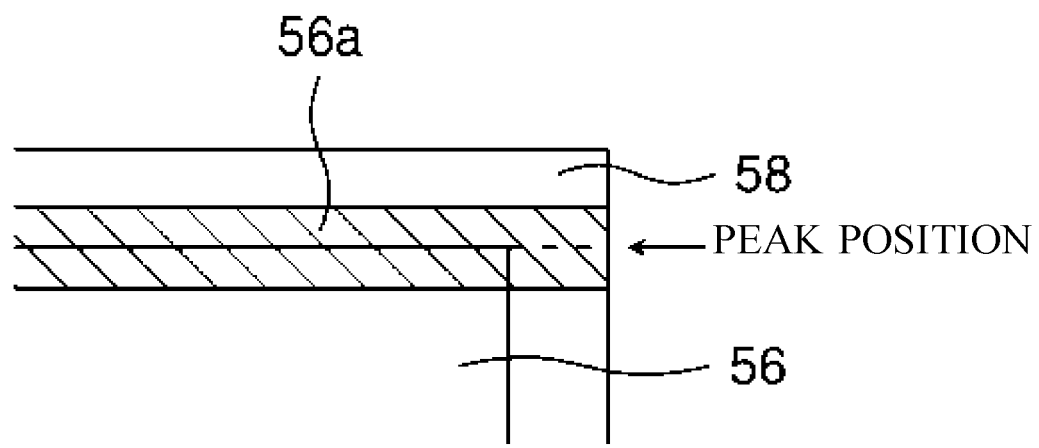
FIG. 7 is a view illustrating the peak position of the distribution of ions on the upper surface of the wiring in the semiconductor device according to the third embodiment.

Ion implantation conditions are set so that the peak of the vertical distribution of ions implanted into the wiring 56 is in the vicinity of the interface between the upper surface of the wiring 56 and the insulating film 58. FIG. 7 is an enlarged view of the vicinity of the upper right of the wiring 56 in FIG. 5, illustrating the peak position of the distribution of ions. The implantation conditions vary depending on the thickness of the insulating film 58, and as one example, when the insulating film is SiN having a thickness of 100 nm and the ion species is Ar, the acceleration energy is 150 keV, and the dose is $1\times10^{12}$ ions/cm$^2$ or more.

As described above, according to the third embodiment, since the peak of the vertical distribution of ions implanted into the wiring 56 is in the vicinity of the interface between the upper surface of the wiring 56 and the insulating film 58, the adhesion between the wiring 56 and the insulating film 58 is further improved. On the other hand, when the ions are directly implanted from above the wiring 16 as in the first embodiment, the peak of the vertical distribution exists inside the upper surface of the wiring 16. Therefore, the semiconductor device 50 according to the third embodiment has higher adhesion between the wiring 56 and the insulating film 58 than the first embodiment.

An oblique ion implantation method, which is the same as that of the second embodiment, may be used for the ion implantation. In that case, the adhesion between the wiring 56 and the insulating film 58 is further improved.

Fourth Embodiment

Figure 8:
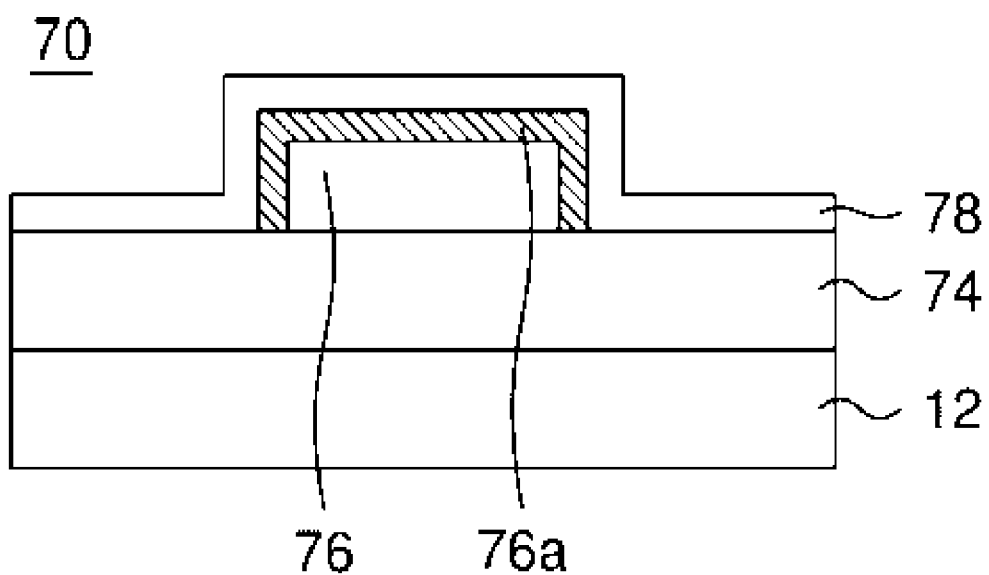
FIG. 8 is a cross-sectional view of the semiconductor device according to the fourth embodiment.

FIG. 8 is a diagram of a semiconductor device 70 according to a fourth embodiment. The semiconductor device 70 is the same as the semiconductor device 30 according to the second embodiment but differs in that there is no ion implantation layer on the upper surface of the insulating film 74 and differs in limitations on the ion-implanted ion species. In addition to Ar, N, or the like, which does not impair the insulating properties even when implanted into the insulating film 14, there may be used ion species such as B, Si, Pd, Ti, Ta, Al, or Co which increases the electrical conductivity of the insulating film when ion-implanted. As described later, these ion species are implanted into the wiring made of Au and act as impurities with respect to Au, and hence an element from which each of these ions originates is referred to herein as an impurity element. The concentration of the impurity element in an ion implantation layer 76a is $1 \times 10^{17}$ cm$^{-3}$ or more and $1 \times 10^{21}$ cm$^{-3}$ or less.

A method for manufacturing the semiconductor device 70 according to the fourth embodiment will be described below. The steps up to the formation of wiring 76 as illustrated in FIG. 9(a) are the same as those of the second embodiment.

Figure 9A:
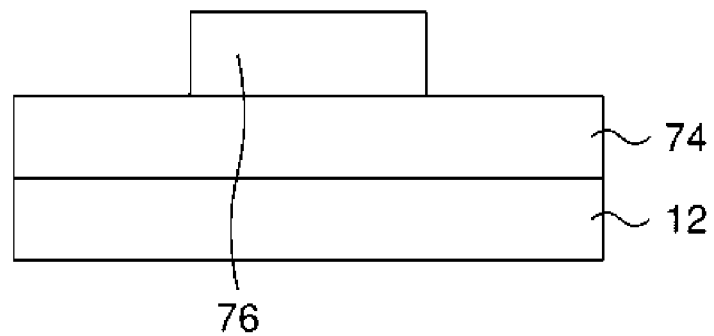
FIGS. 9A-9C are views showing the method for manufacturing the semiconductor device according to the fourth embodiment.
Figure 9B:
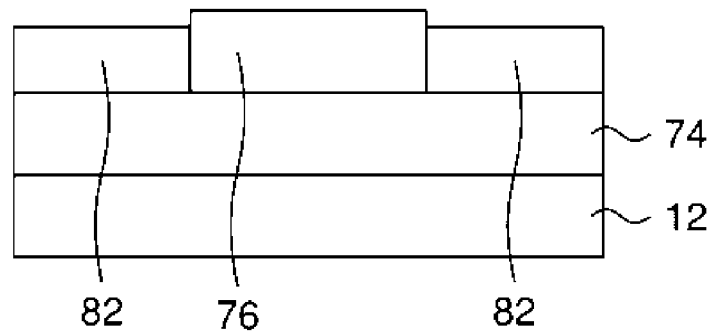

After FIG. 9(a), as illustrated in FIG. 9(b), a resist 82 is formed in a region not covered with the wiring 76 on the upper surface of the insulating film 74.

Figure 9C:
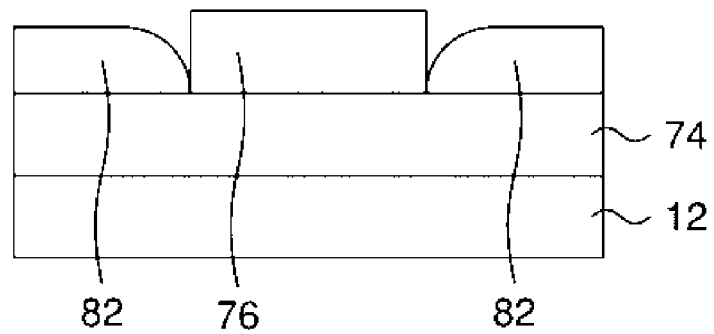

Next, as illustrated in FIG. 9(c), heat treatment at 90° C. or higher is applied to thermally deform the resist 82 to expose at least a part of a region in contact with the resist 82 on the side surface of the wiring 76.

Figure 10A:
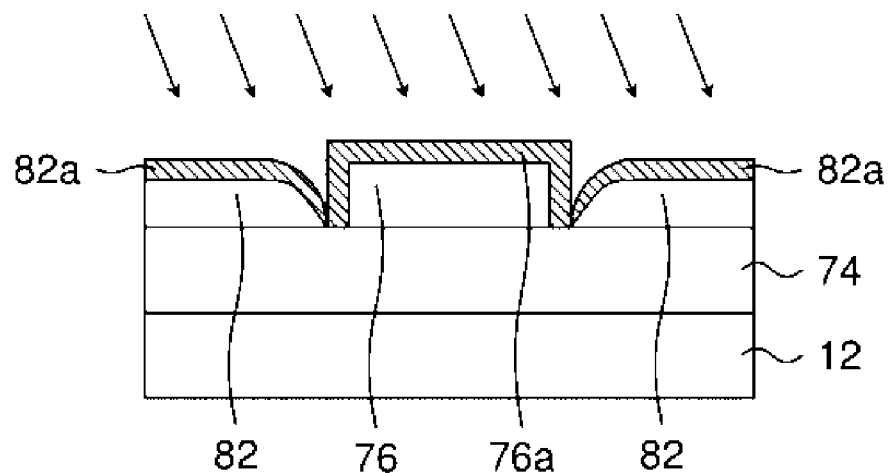
FIGS. 10A-10C are views showing the method for manufacturing the semiconductor device according to the fourth embodiment.

Subsequently, as illustrated in FIG. 10(a), ions are implanted into the upper surface of the wiring 76, at least a part of the side surface of the wiring 76, and the upper surface of the resist 82 by an oblique ion implantation method. By the ion implantation, an ion implantation layer 76a is formed on the upper surface of the wiring 76 and at least the upper portion of the side surface of the wiring 76, and an ion implantation layer 82a is formed on the upper surface of the resist 82. The ion implantation layer 76a formed on the upper surface of the wiring 76 comes into a chemically unstable state due to the ions as impurities being implanted. When the ion species is B, Si, Pd, Ti, Ta, Al, or Co, the ion implantation layer 76a becomes an alloy with Au by annealing after the ion implantation.

Figure 10B:
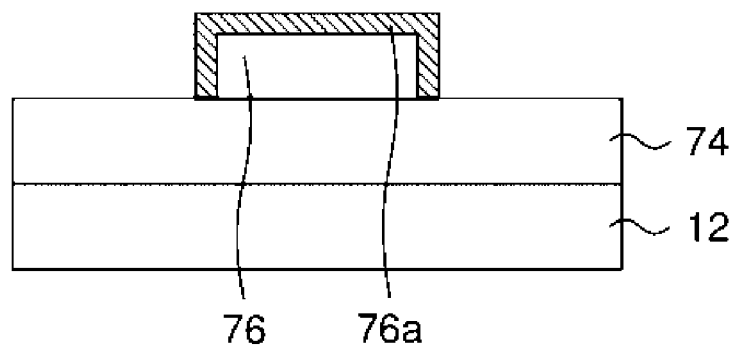

Next, as illustrated in FIG. 10(b), the resist 82 is removed.

Figure 10C:
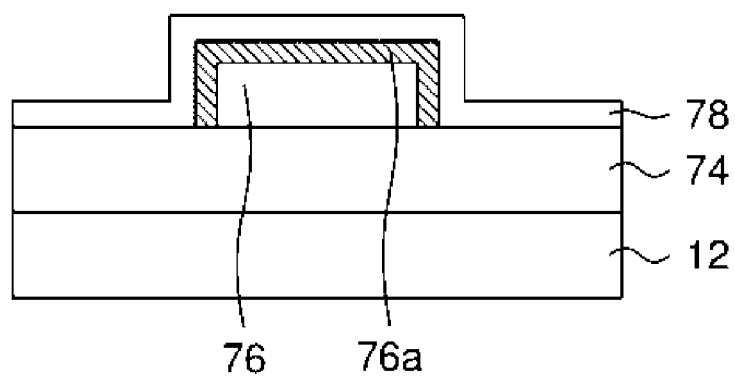

Subsequently, as illustrated in FIG. 10(c), an insulating film 78 is formed so as to cover the wiring 76.

As described above, according to the fourth embodiment, at the time of the ion implantation, the resist 82 is formed on the insulating film 74, and the ions are not implanted directly on the insulating film 74, so that the insulating film 74 is not damaged. Further, even if the insulating properties of the insulating film 74 are impaired when the ion species is implanted into the insulating film 74, the insulating properties of the insulating film 74 are not impaired.

When the ion species is B, Si, Pd, Ti, Ta, Al, or Co, the ion implantation layer 76a becomes an alloy with Au by annealing after the ion implantation, and the adhesion between the wiring 76 and the insulating film 78 is further improved.

Figure 11:
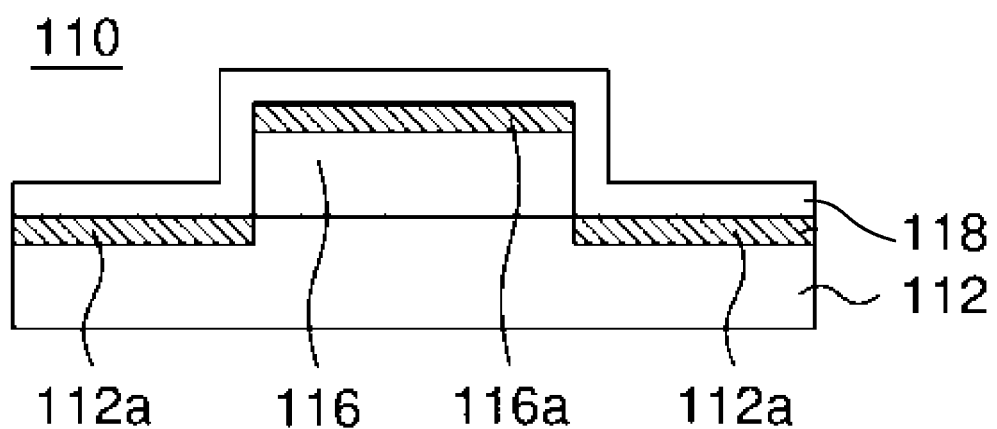
FIG. 11 is a cross-sectional view of the semiconductor device in which the insulating film does not be provided between the semiconductor substrate and the wiring.

The insulating film has been provided between the semiconductor substrate and the wiring in all the embodiments, but the insulating film may not be provided. In that case, for example, as illustrated in FIG. 11, the wiring 116 is formed on the semiconductor substrate 112.

REFERENCE SIGNS LIST 10, 30, 50, 70, 110 semiconductor device
12, 112 semiconductor substrate
14, 54, 74 insulating film
14a, 14a, 54a, 82a, 112a ion implantation layer
16, 36, 56, 76, 116 wiring
16a, 36a, 56a, 76a, 116a ion implantation layer
18, 58, 78, 118 insulating film
82 resist

The invention claimed is:

1. A method for manufacturing a semiconductor device comprising, in the following order:
   forming a first insulating film on a semiconductor substrate;
   forming, on the first insulating film, wiring in which at least an uppermost layer is made of Au;
   implanting ions, that do not impair insulating properties even when implanted into the insulating film, into an upper surface of the wiring and a region not covered with the wiring on an upper surface of the first insulating film; and
   forming a second insulating film that covers the wiring.

2. The method for manufacturing a semiconductor device according to claim 1, wherein the ions are Ar or N.

3. The method for manufacturing a semiconductor device according to claim 1, wherein
   at least an upper portion of a side surface of the wiring is made of Au, and
   the ions are also implanted into the side surface of the wiring by using an oblique ion implantation method as a method for implanting the ions.

4. A method for manufacturing a semiconductor device comprising:
   forming a first insulating film on a semiconductor substrate;
   forming, on the first insulating film, wiring in which at least an uppermost layer is made of Au;
   forming a second insulating film that covers the wiring; and
   implanting ions, that do not impair insulating properties even when implanted into the insulating film, into an upper surface of the wiring and a region not covered with the wiring on an upper surface of the first insulating film,
   wherein a peak of a distribution of the ions implanted into each of the wiring and the second insulating film is in a vicinity of an interface between the upper surface of the wiring and the second insulating film.

5. The method for manufacturing a semiconductor device according to claim 4, wherein the ions are Ar or N.

6. The method for manufacturing a semiconductor device according to claim 4, wherein
   at least an upper portion of a side surface of the wiring is made of Au, and
   the ions are also implanted into the side surface of the wiring by using an oblique ion implantation method as a method for implanting the ions.

7. A method for manufacturing a semiconductor device comprising, in the following order:
   forming a first insulating film on a semiconductor substrate;

forming, on the first insulating film, wiring in which at least an uppermost layer and at least an upper portion of a side surface are made of Au;

forming a resist in a region not covered with the wiring on an upper surface of the first insulating film;

deforming the resist by heat treatment to expose at least a part of a region in contact with the resist on the side surface of the wiring;

implanting ions into an upper surface of the wiring, at least the upper portion of the side surface of the wiring, and an upper surface of the resist by an oblique ion implantation method;

removing the resist; and forming a second insulating film that covers the wiring.

8. The method for manufacturing a semiconductor device according to claim 7, wherein the ions are any one of B, Si, Pd, Ti, Ta, Al, Co, Ar, and N.

9. A semiconductor device comprising:

a semiconductor substrate;

a first insulating film on the semiconductor substrate;

wiring in which at least an uppermost layer is made of Au on the first insulating film; and a second insulating film covering the wiring, wherein an insulating non-destructive element exists in a vicinity of an upper surface of the wiring and in a vicinity of a region not covered with the wiring on an upper surface of the first insulating film at a concentration of $1\times10^{17}$ cm$^{-3}$ or more and $1\times10^{21}$ cm$^{-3}$ or less.

10. The semiconductor device according to claim 9, wherein the insulating non-destructive element also exists in a vicinity of a lower surface of the second insulating film, and a peak of a distribution of the insulating non-destructive element on each of the upper surface of the wiring and the lower surface of the second insulating film in contact with the upper surface of the wiring is in a vicinity of an interface between the upper surface of the wiring and the second insulating film.

11. The semiconductor device according to claim 9, wherein the insulating non-destructive element is Ar or N.

12. The semiconductor device according to claim 9, wherein at least an upper portion of a side surface of the wiring is made of Au, and the insulating non-destructive element also exists in a vicinity of the side surface of the wiring at a concentration of $1\times10^{17}$ cm$^{-3}$ or more and $1\times10^{21}$ cm$^{-3}$ or less.

* * * * *